(12) United States Patent
Groshert et al.

(10) Patent No.: US 10,784,485 B2
(45) Date of Patent: Sep. 22, 2020

(54) CELL CONTACT-MAKING SYSTEM FOR AN ELECTROCHEMICAL DEVICE

(71) Applicant: ElringKlinger AG, Dettingen (DE)

(72) Inventors: Jan Groshert, Dettingen/Erms (DE);
Wolfgang Fritz, Metzingen (DE);
Moritz Bertsch, Dettingen/Erms (DE)

(73) Assignee: ElringKlinger AG, Dettingen (DE)

( * ) Notice: Subject to any disclaimer, the term of this patent is extended or adjusted under 35 U.S.C. 154(b) by 759 days.

(21) Appl. No.: 15/616,228

(22) Filed: Jun. 7, 2017

(65) Prior Publication Data

US 2017/0271642 A1 Sep. 21, 2017

Related U.S. Application Data

(63) Continuation of application No. PCT/EP2015/078405, filed on Dec. 2, 2015.

(30) Foreign Application Priority Data

Dec. 9, 2014 (DE) .................. 10 2014 118 188

(51) Int. Cl.
| | |
|---|---|
| *H01M 2/20* | (2006.01) |
| *H01M 10/42* | (2006.01) |
| *H01R 12/00* | (2006.01) |
| *H05K 1/02* | (2006.01) |
| *H01R 12/59* | (2011.01) |

(Continued)

(52) U.S. Cl.
CPC ............. *H01M 2/202* (2013.01); *B60L 50/64* (2019.02); *H01M 2/206* (2013.01); *H01M 10/425* (2013.01); *H01M 10/48* (2013.01); *H01M 10/482* (2013.01); *H01R 12/00* (2013.01); *H01R 12/592* (2013.01); *H01R 12/616* (2013.01); *H05K 1/0201* (2013.01); *H01M 10/0525* (2013.01); *H01M 2220/20* (2013.01);

(Continued)

(58) Field of Classification Search
CPC .... H01M 2/202; H01M 10/482; H01R 12/00; H01R 12/592; H01R 12/616; H05K 1/0201

See application file for complete search history.

(56) References Cited

U.S. PATENT DOCUMENTS

| | | | |
|---|---|---|---|
| 10,391,882 B2 * | 8/2019 | Aschwer | ............. H01M 2/1077 |
| 2008/0156511 A1 | 7/2008 | Hauer et al. | |

(Continued)

FOREIGN PATENT DOCUMENTS

| | | |
|---|---|---|
| DE | 10 2010 043 885 | 3/2012 |
| DE | 10 2013 207 358 | 10/2014 |
| EP | 2 768 294 | 8/2014 |

*Primary Examiner* — Stewart A Fraser
(74) *Attorney, Agent, or Firm* — Womble Bond Dickinson (US) LLP

(57) ABSTRACT

A cell contact-making system for an electrochemical device that includes a plurality of electrochemical cells is provided. The cell contact-making system includes a signal conductor system having one or more signal conductors for electrically conductively connecting a signal source to a signal conductor terminal connector or to a monitoring arrangement of the electrochemical device, wherein the signal conductor system includes at least one flexible printed circuit, wherein the flexible printed circuit includes at least one flexible insulating film and at least one conductor track that is arranged on the insulating film.

18 Claims, 15 Drawing Sheets

(51) Int. Cl.
  *H01M 10/48* (2006.01)
  *B60L 50/64* (2019.01)
  *H01R 12/61* (2011.01)
  *H01M 10/0525* (2010.01)

(52) U.S. Cl.
  CPC ......... *Y02E 60/122* (2013.01); *Y02T 10/7005* (2013.01); *Y02T 10/705* (2013.01)

(56) References Cited

U.S. PATENT DOCUMENTS

| | | | |
|---|---|---|---|
| 2013/0244499 A1* | 9/2013 | Heck | H01R 13/00 439/682 |
| 2013/0295429 A1 | 11/2013 | Makie | |
| 2014/0342191 A1 | 11/2014 | Shin et al. | |
| 2016/0043446 A1* | 2/2016 | Fritz | H01M 10/425 429/90 |
| 2017/0133656 A1* | 5/2017 | Roemer | H01M 10/482 |

\* cited by examiner

CELL CONTACT-MAKING SYSTEM FOR AN ELECTROCHEMICAL DEVICE

CROSS-REFERENCE TO RELATED APPLICATIONS

This application is a continuation application of PCT/EP2015/078405, filed on Dec. 2, 2015, and claims the benefit of German application number 10 2014 118 188.3, filed on Dec. 9, 2014, which are incorporated herein by reference in their entirety for all purposes.

FIELD OF DISCLOSURE

The present invention relates to a cell contact-making system for an electrochemical device that includes a plurality of electrochemical cells, wherein the cell contact-making system includes a signal conductor system having one or more signal conductors for electrically conductively connecting a signal source to a signal conductor terminal connector or to a monitoring arrangement of the electrochemical device.

A cell contact-making system of this kind serves in particular for individual cell monitoring of the electrochemical cells of the electrochemical device in respect of physical measuring variables such as voltage and temperature. For this purpose, for example electrical potential differences are measured and/or temperatures in the vicinity of the cell terminals of electrochemical cells are detected by means of suitable temperature sensors. The signal sources or measuring points are electrically conductively connected by the signal conductor system directly to a monitoring arrangement of the electrochemical device or to a signal conductor system that serves as the interface to a monitoring arrangement of this kind.

BACKGROUND

In known cell contact-making systems, connecting the signal sources to the signal conductor terminal connector requires considerable complexity in terms of the manufacturing technology.

In particular, depending on the concept applied, partly manual manufacturing steps and additional process steps are required, such as coating, compacting or providing an additional material transition.

SUMMARY OF THE INVENTION

The object of the present invention is to provide a cell contact-making system of the type mentioned in the introduction that is producible as simply as possible and yet reliably and with precise positioning.

This object is achieved according to the invention with a cell contact-making system in that the signal conductor system includes at least one flexible printed circuit, wherein the flexible printed circuit includes at least one flexible insulating film and at least one conductor track that is arranged on the insulating film.

Preferably, the thickness of the insulating film, which is electrically insulating, is less than 0.5 mm.

In a preferred embodiment of the cell contact-making system according to the invention, it is provided for the cell contact-making system to include at least one cell connector for electrically conductively connecting cell terminals of different electrochemical cells and/or at least one current terminal connector for electrically conductively connecting the electrochemical device to another electrochemical device or to a consumer, wherein at least one conductor track includes a connection portion at which the conductor track is electrically conductively connected to a cell connector or a current terminal connector.

The conductor track is preferably connected to the cell connector by a substance-to-substance bond, for example by welding and/or soldering.

A connection portion of this kind may in particular take the form of a welding pad, which may preferably be of any construction and is welded directly to the cell connector or current terminal connector or to a terminal connector element that is fixed to the cell connector or current terminal connector.

As a result, there is no need for a soldering procedure for connecting the conductor track to the signal source.

The welding may in particular be performed by an ultrasonic welding method, a friction welding method or a friction stir welding method.

The connection portion of the conductor track is integrated into the flexible printed circuit, with the result that in particular there is no need for a separate positioning procedure for positioning the connection portion in relation to the signal source that is to be connected thereto, but rather positioning the flexible printed circuit as a whole in relation to the signal sources is sufficient.

As a result of welding the connection portion to the signal source or to a terminal connector element that is fixed to the signal source, the need to use coated components is in particular also dispensed with.

The cell connectors and the current terminal connectors together form a current conductor system of the cell contact-making system that enables an electrical current to flow from and to the electrochemical cells of the electrochemical device.

As a result of the flexibility and hence ready deformability of the printed circuit, it is possible for component tolerances to be compensated when the cell contact-making system is assembled, and/or different thermal expansions of the components carrying the signal sources on the one hand and the signal conductor system on the other to be compensated during operation of the electrochemical device.

The electrically conductive connection between the connection portion and the cell connector or current terminal connector can take different forms.

For example, it may be provided for the connection portion to be fixed directly to a base body of the cell connector or current terminal connector, preferably in a substance-to-substance bond.

In this case, the connection portion may be particular be fixed to the base body by welding, in particular ultrasonic welding, friction welding or friction stir welding, or by soldering.

The base body of the cell connector or current terminal connector includes at least one contact region of the cell connector or current terminal connector with which the cell connector or current terminal connector is fixed to a cell terminal of an electrochemical cell of the electrochemical device.

The base body may also include two contact regions of this kind that are fixed to the cell terminals of different electrochemical cells of the electrochemical device.

In order to enable the connection portion to be joined to the cell connector or the current terminal connector, it may be provided for the connection portion to project laterally beyond an outer edge of the at least one insulating film.

As an alternative or in addition thereto, it may also be provided for the at least one insulating film to have, in the region of the connection portion, a window which is configured for contact to be made therethrough between the connection portion and the cell connector or current terminal connector or a joining tool, for example a sonotrode for an ultrasonic welding procedure.

The connection portion may have a region that projects towards the cell connector or current terminal connector.

A projecting region of this kind may for example be stamped into the connection portion.

As an alternative or in addition to a direct connection between the connection portion and a base body of the cell connector or current terminal connector, it may also be provided for the connection portion to be electrically conductively connected to the cell connector or current terminal connector indirectly, by way of a terminal connector element.

A terminal connector element of this kind may take the form for example of a terminal connector lug.

Further, it may be provided for the terminal connector element to take an angled form.

A portion of the terminal connector element may extend through a passage opening in the connection portion.

As an alternative or in addition to the possible connections explained above, it may also be provided for the connection portion to be electrically conductively connected to the cell connector or current terminal connector by means of a bonding conductor.

A bonding conductor of this kind is electrically conductively connected to the connection portion of the conductor track preferably by means of at least one bonding connection, and/or is electrically conductively connected to a base body of the cell connector or current terminal connector preferably by means of at least one bonding connection.

A bonding connection of this kind may in particular be made by ultrasonic bonding.

As an alternative or in addition to the connecting methods explained above, it may also be provided for the connection portion of the conductor track to be electrically conductively connected to the cell connector or current terminal connector by means of a crimping element.

All the methods explained above for electrically conductively connecting a connection portion to a cell connector or current terminal connector may also be combined with one another within the same cell contact-making system, in which case different connection portions of the signal conductor system are electrically conductively connected to the respectively associated cell connector or current terminal connector in different ways.

In a preferred embodiment of the invention, it is provided for the flexible printed circuit to include at least two flexible insulating films between which at least one conductor track is arranged.

In this case, it may be provided for two flexible insulating films to take a form that is adhesive on at least one side and to adhere to one another and to at least one conductor track of the signal conductor system.

Further, it may be provided for at least one flexible printed circuit to have at least one fold. A fold of this kind may be used to change the external contour of the flexible printed circuit from the external contour with which the at least one flexible insulating film was separated from a starting material, for example being punched or cut out.

Here, a fold of this kind can reduce the space needed by the flexible printed circuit.

In a particular embodiment of the invention, it is provided for the signal conductor system to have a sensor which is arranged on a flexible printed circuit of the signal conductor system and is electrically conductively connected to at least one conductor track of the flexible printed circuit.

Here, the sensor is preferably arranged on a flexible printed circuit of the signal conductor system before the signal conductor system is mounted in the cell contact-making system and the conductor tracks that lead to the cell connectors or current terminal connectors of the cell contact-making system are electrically conductively connected to the respectively associated cell connector or current terminal connector.

The sensor is thus integrated into the flexible printed circuit of the signal conductor system, as a result of which an additional process step of electrically conductively connecting a temperature sensor to the signal conductor system during assembly of the cell contact-making system can be eliminated.

In a particular embodiment of the invention, it is provided for the cell contact-making system to include a support element, in particular in the form of a support board, on which the signal conductor system is arranged, wherein the sensor is movable, as a result of deformation of the flexible printed circuit, from a first position in relation to the support element into a second position in relation to the support element. In this way, it is possible to select the position of the sensor during operation of the electrochemical device when the cell contact-making system is assembled.

The support element may have a passage opening through which there extends a sensor portion, carrying the sensor, of a flexible printed circuit of the signal conductor system.

The sensor portion of the flexible printed circuit preferably includes at least one insulating film and at least one conductor track that is arranged on the insulating film.

In principle, the sensor may serve to measure any desired physical variables.

Preferably, it is provided for the sensor to take the form of a temperature sensor.

If the cell contact-making system includes a support element on which the signal conductor system is arranged, then the support element preferably includes at least one positioning element on the support element side which cooperates with a positioning element on the signal conductor system side such that the signal conductor system is positioned in a desired location in relation to the support element and hence preferably also in relation to the cell connectors and/or current terminal connectors of the electrochemical device.

Here, a positioning element on the support element side may take the form of a positioning peg that cooperates with a positioning element on the signal conductor system side, in the form of a positioning hole. In principle, however, it would also be possible for a positioning element on the support element side in the form of a positioning hole to cooperate with a positioning element on the signal conductor system side, in the form of a positioning peg.

The support element is preferably placeable on a housing of the electrochemical device in which a plurality of electrochemical cells are arranged.

The cell contact-making system according to the invention is suitable in particular for use with an electrochemical device that takes the form of a battery, for example a lithium ion battery.

If the electrochemical device takes the form of a battery, it is suitable in particular as a high-load energy source, for example for driving motor vehicles.

Further features and advantages of the invention form the subject matter of the description below and the representation in the drawing of exemplary embodiments.

BRIEF DESCRIPTION OF THE DRAWINGS

Like or functionally equivalent elements are designated by the same reference numerals in all the Figures.

DETAILED DESCRIPTION OF THE INVENTION

Figure 1:
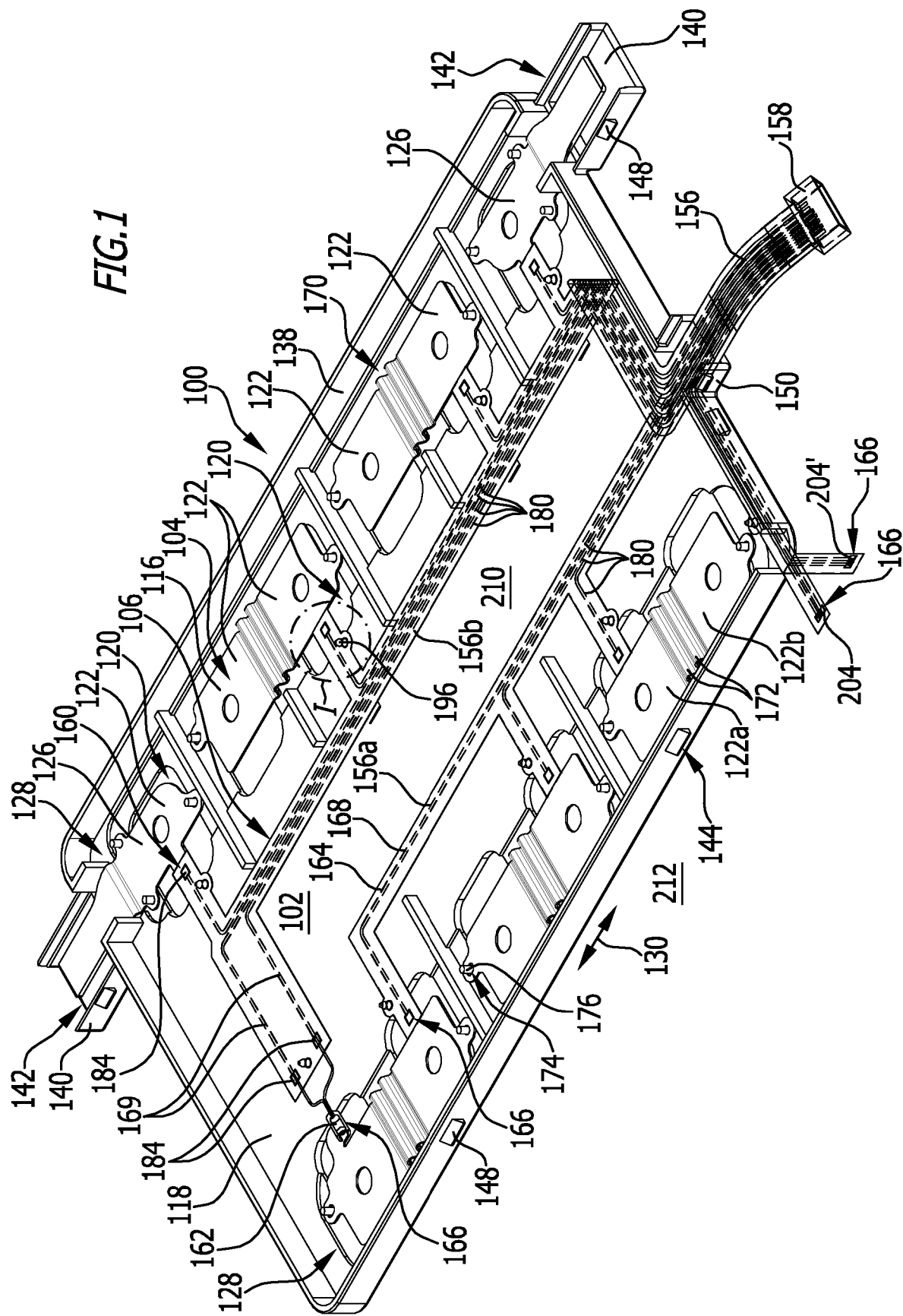
FIG. 1 shows a perspective illustration of a support element of a cell contact-making system for an electrochemical device, in particular a battery module, of a current conductor system that is held on the support element and a signal conductor system that is held on the support element, wherein the signal conductor system includes two flexible printed circuits on each of which a plurality of conductor tracks are arranged.

A cell contact-making system that is designated 100 as a whole and is illustrated in FIGS. 1 to 11 includes a support element 102 on which a current conductor system 104 and a signal conductor system 106 are held, and a cover element 108 that is placeable on the support element 102 and is illustrated in FIGS. 5 to 8.

The support element 102 is placeable on a housing 110 (illustrated in FIG. 3) of an electrochemical device 112, for example a battery module, having a plurality of electrochemical cells 114, in particular battery cells, and, in the assembled condition of the electrochemical device 112, closes an upper housing opening through which cell terminals 116 of the electrochemical cells 114 of the electrochemical device 112 project.

The support element 102 may for example take the form of a preferably substantially rectangular support board 118.

The support element 102 is provided with a plurality of passage openings 120, wherein each passage opening 120 is associated on the one hand with a respective contact region 122 of a cell connector 124 or current terminal connector 126 and on the other with a respective cell terminal 116 of the electrochemical cells 114 of the electrochemical device 112, with the result that a respective cell terminal 116 is connectable, through a passage opening 120 of this kind, to an associated contact region 122 of a cell connector 124 or current terminal connector 126.

Here, a cell terminal 116 may for example extend through the passage opening 120 in order to come into contact with a contact region 122 of a cell connector 124 or current terminal connector 126.

As an alternative hereto, it is also possible for a contact region 122 of a cell connector 124 or current terminal connector 126 to extend through the respectively associated passage opening 120 in order to come into contact with the respectively associated cell terminal 116.

Further, it is also conceivable for both the cell terminal 116 and the contact region 122 of the cell connector 124 or current terminal connector 126 to extend into the passage opening 120 and to be connected to one another there.

Figure 9:
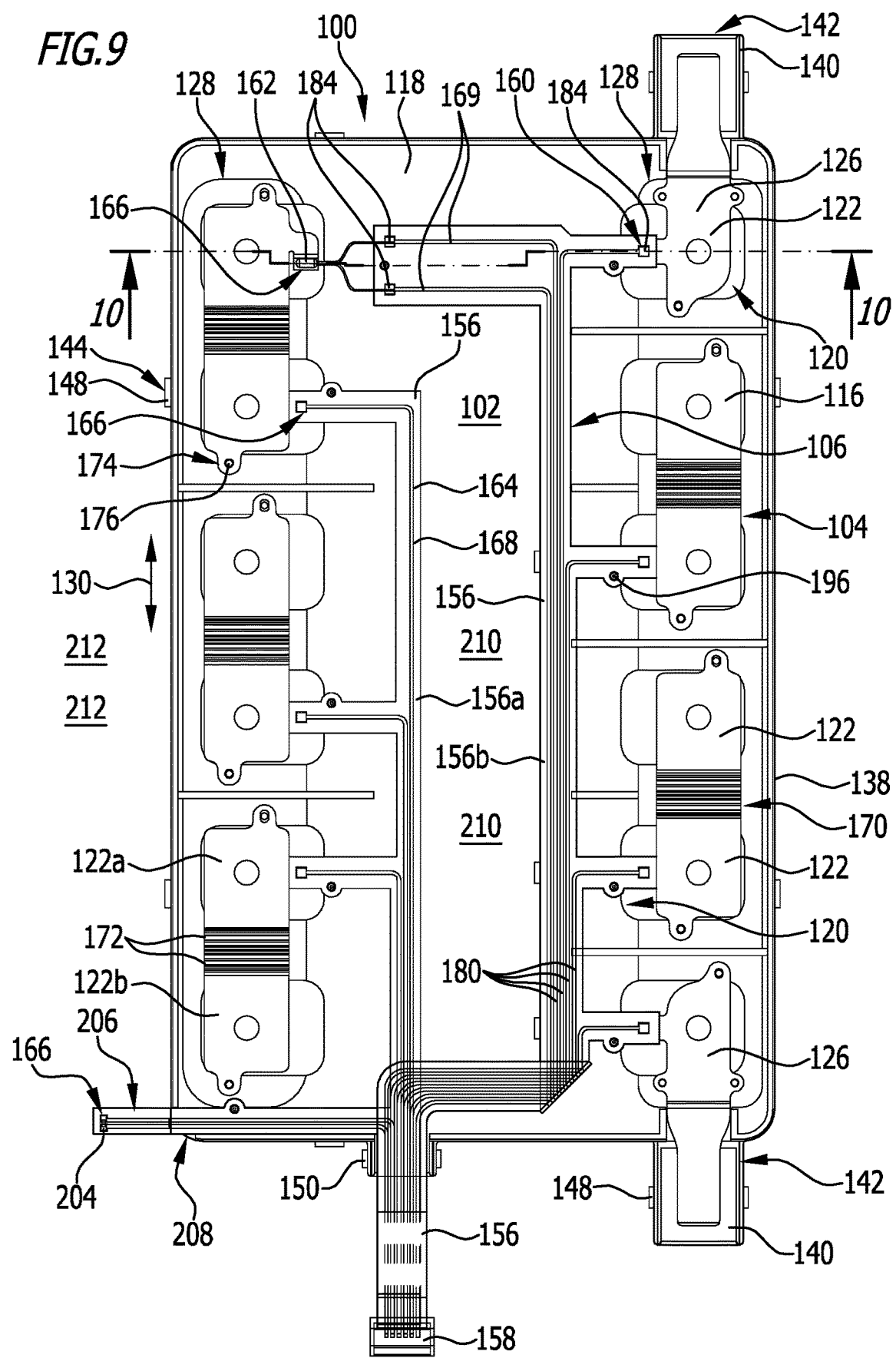
FIG. 9 shows a plan view from above of the cell contact-making system (without the support element) from FIG. 1.
Figure 10:
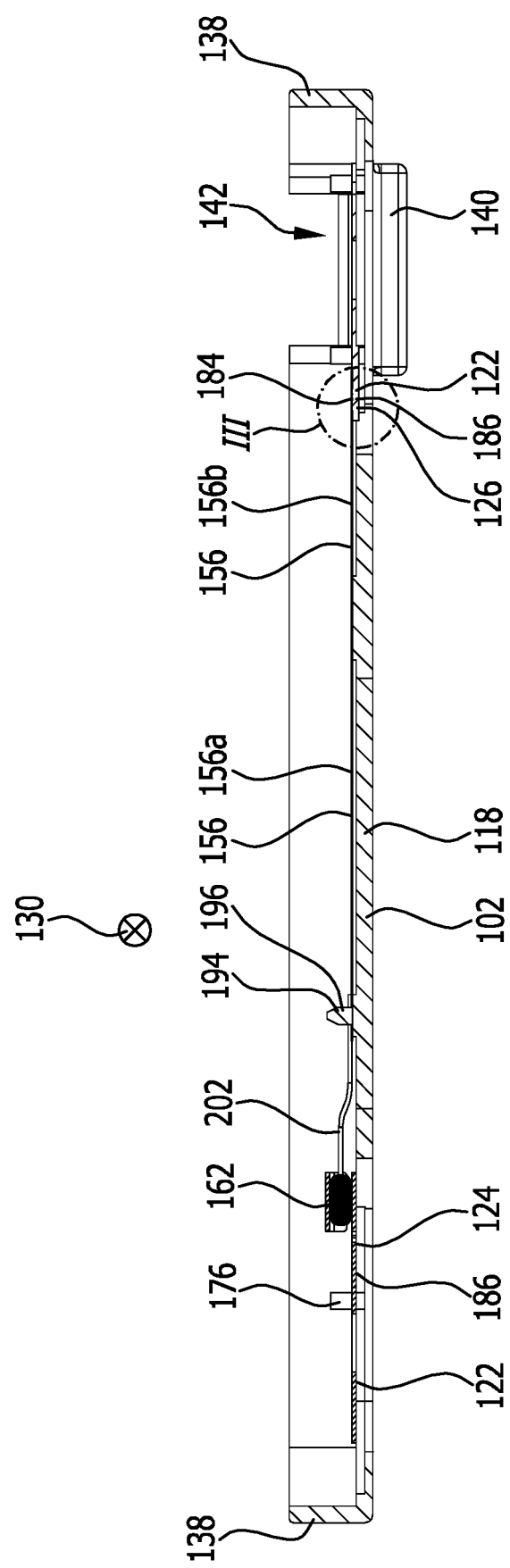
FIG. 10 shows a cross section through the cell contact-making system from FIG. 9, along the line 10-10 in FIG. 9.

As can be seen from FIGS. 1 and 9, the passage openings 120 of the support element 102 may be arranged in a plurality of rows 128, wherein the rows 128 extend for example in a longitudinal direction 130 of the support element 102.

On the upper side of the support element 102, which is remote from the electrochemical cells 114 in the assembled condition of the cell contact-making system 100, there is arranged the cover element 108, which serves to cover the current conductor system 104 and the signal conductor system 106 and in particular covers up a plurality, preferably all, of the cell connectors 124.

The cover element 108 takes the form for example of a substantially rectangular cover plate 132.

The cover element 108 and/or the support element 102 preferably comprise a plastics material, in particular a thermoplastic material, for example polypropylene.

Preferably, the cover element 108 and/or the support element 102 are formed substantially entirely from the plastics material, in particular the thermoplastic material, for example polypropylene.

Figure 5:
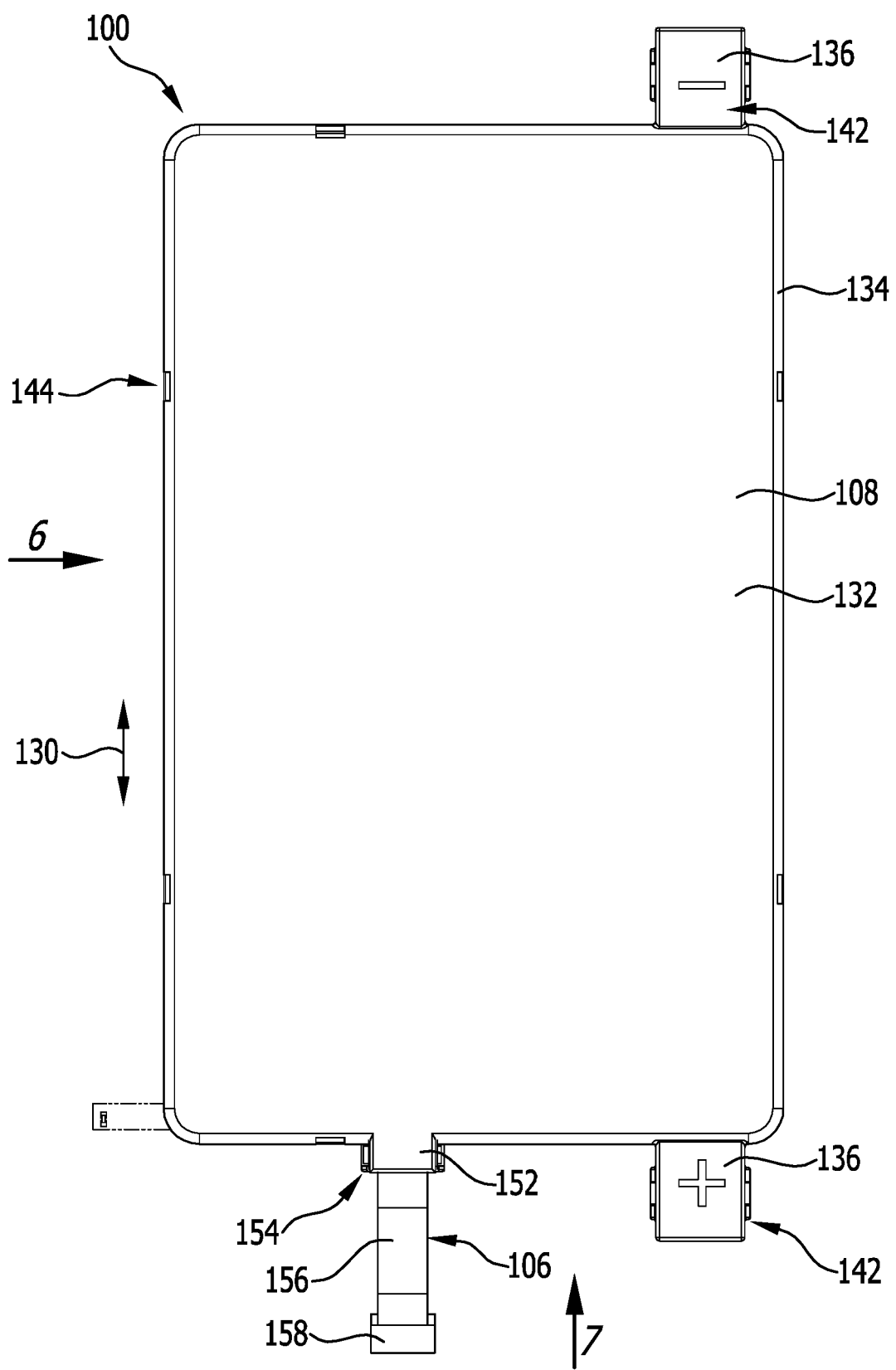
FIG. 5 shows a plan view from above of the cell contact-making system from FIG. 1, wherein a cover element has been placed on the support element of the cell contact-making system.
Figure 6:
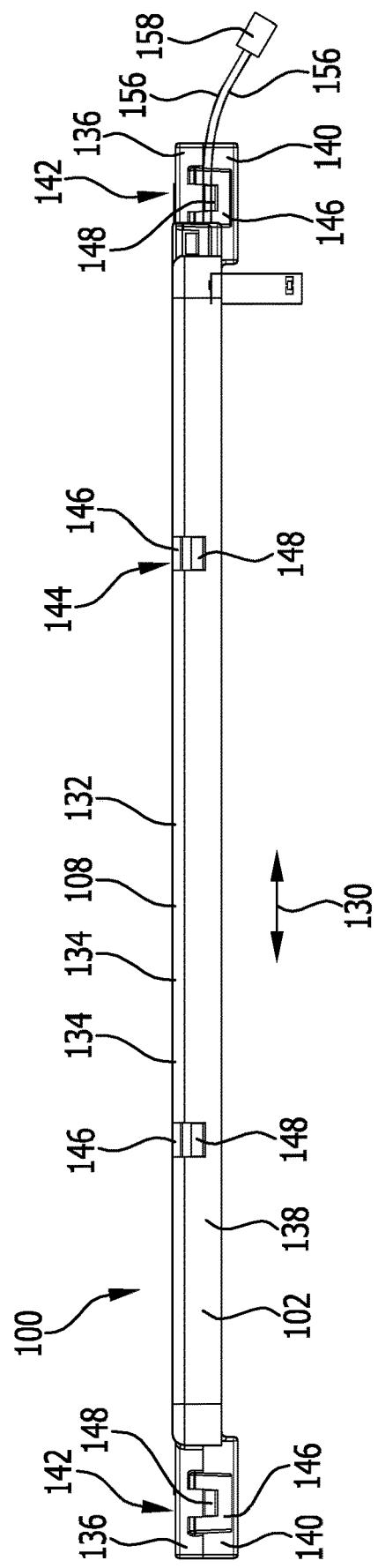
FIG. 6 shows a side view of the cell contact-making system from FIG. 5, with the direction of view in the direction of the arrow 6 in FIG. 5.
Figure 7:
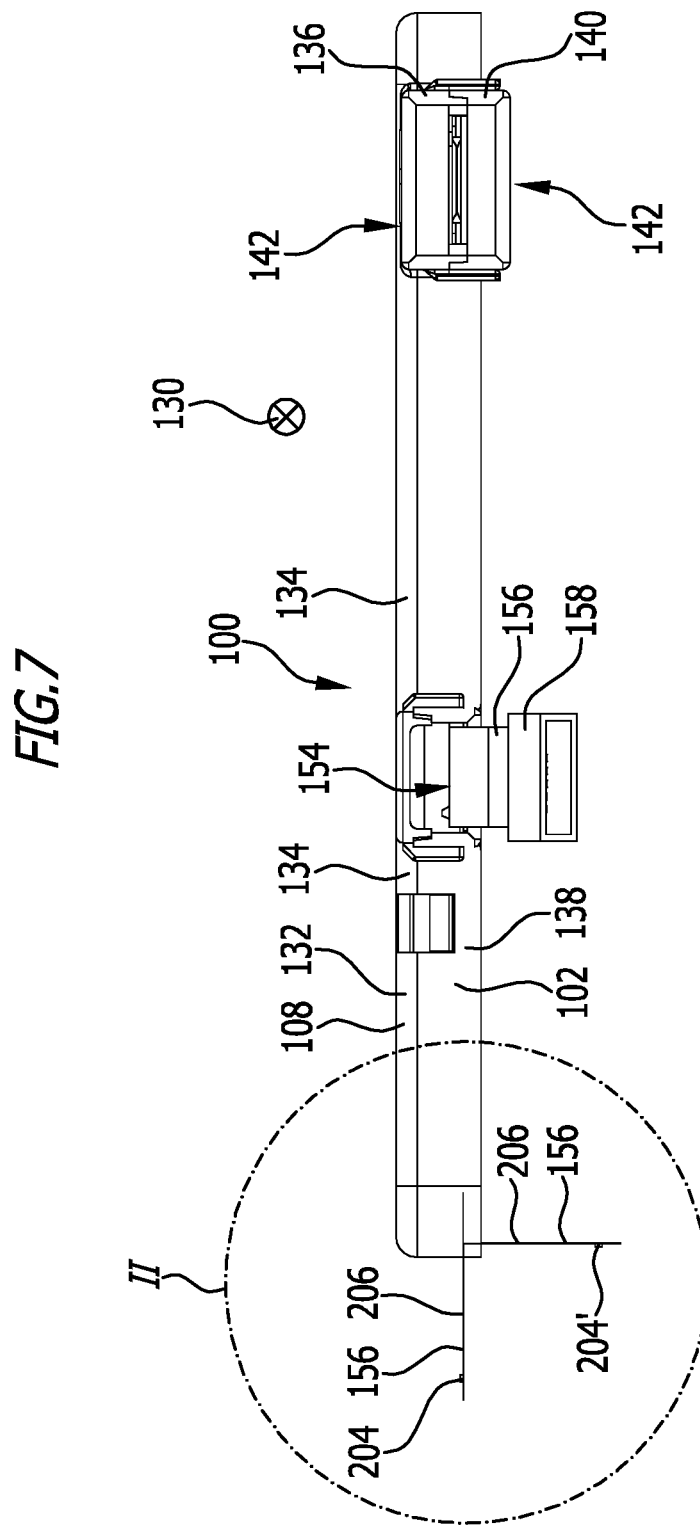
FIG. 7 shows a front view of the cell contact-making system from FIGS. 5 and 6, with the direction of view in the direction of the arrow 7 in FIG. 5.

As can be seen from FIGS. 5 to 7, the cover element 108 is further preferably provided with an edge region 134 which runs along an outer edge and, in the assembled condition of the cell contact-making system 100, projects towards the support element 102.

The edge region 134 of the cover element 108 may be interrupted by two passage conduits 136 which project from the edge of the cover element 108, for example in the longitudinal direction 130 to front or rear, and may have for example a substantially U-shaped cross section.

As can best be seen from FIG. 1, the support element 102 is also preferably provided with an edge region 138 which runs along an outer edge and, in the assembled condition of the cell contact-making system 100, projects towards the cover element 108.

The edge region 138 of the support element 102 may also be interrupted by two passage conduits 140 which project from the edge of the support element 102, preferably in the longitudinal direction 130 to front or rear, and may have for example a substantially U-shaped cross section.

The passage conduits 140 of the support element 102 and the passage conduits 136 of the cover element 108 are arranged at mutually corresponding points on the respective edge regions 138 and 134 and face one another by means of their open sides, with the result that the passage conduits 140, 136 together form a respective passage duct 142 which serves to receive a respective one of the current terminal connectors 126 of the cell contact-making system 100.

The current terminal connectors 126 and the cell connectors 124 by means of which the cell terminals 116 of each two mutually adjoining electrochemical cells 114 of different polarity are electrically conductively connectable to one another together form the current conductor system 104 of the cell contact-making system 100.

The current conductor system 104 serves to enable current to flow between the electrochemical cells 114 of the electrochemical device 112 and to or from the current terminal connectors 126 of the cell contact-making system 100.

As a result of this current conductor system 114, for example the electrochemical cells 114 of the electrochemical device 112 are connected electrically in series.

Figure 3:
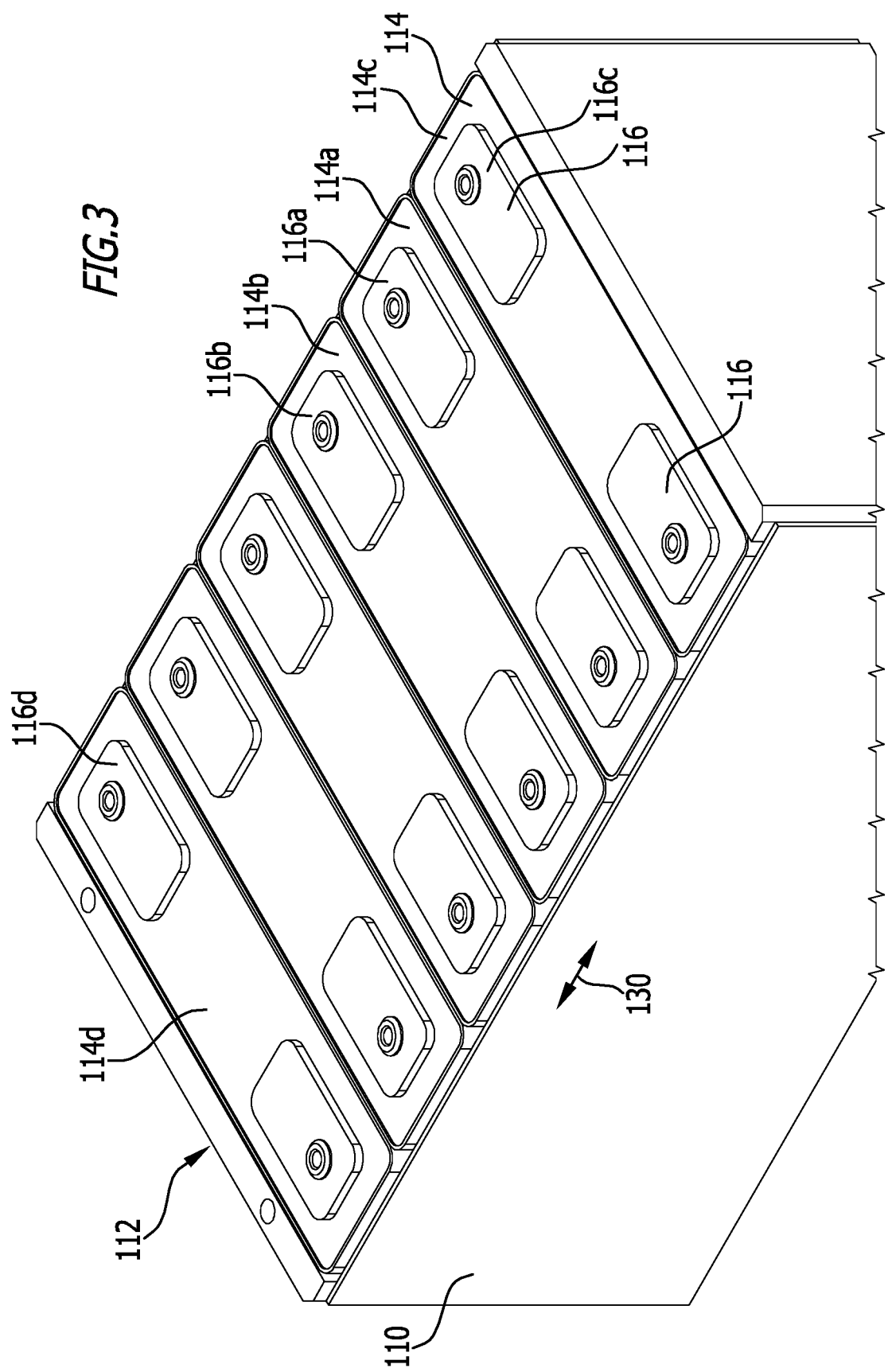
FIG. 3 shows a perspective illustration of an electrochemical device having a housing and a plurality of electrochemical cells arranged therein, wherein the cell contact-making system is placeable on the housing and is electrically conductively connectable to cell terminals of the electrochemical cells.

In this arrangement, each cell connector 124 connects a first cell terminal 116*a* of negative polarity of a first electrochemical cell 114*a* to a second cell terminal 116*b* of positive polarity of an adjoining second electrochemical cell 114*b* (see FIG. 3).

In each case, a cell terminal 116*c* of the electrochemical cell 114*c* that forms the start of the series connection of cells of the electrochemical device 112 and a cell terminal 116*d* of the electrochemical cell 114*d* that forms the end of the series connection of cells are electrically conductively connected to one of the electrically conductive current terminal connectors 126 of the cell contact-making system 100.

A plurality of electrochemical devices 112 each having a cell contact-making system 100 are preferably connected electrically in series.

A series connection of this kind may be made in particular if a current terminal connector 126 of a first electrochemical device 112 is electrically conductively connected, by means of a module connector (not illustrated), to an electrical current terminal connector 126 (of the opposite polarity) of a second electrochemical device 112.

So that the cover element 108 can be detachably fixed to the support element 102, preferably a latching device 144 is provided that includes one or more latching elements 146 provided on the cover element 108 and one or more latching elements 148 provided on the support element 102.

The latching elements 146 on the cover element side and the latching elements 148 on the support element side are arranged at mutually corresponding points on the edge region 134 of the cover element 108 and the edge region 138 of the support element 102 and are latched to one another when the cover element 108 is placed on the support element 102, with the result that the cover element 108 is held detachably on the support element 102 by means of the latching device 144.

The support element 102 is preferably provided, at its edge region 138, with a terminal connector recess or a terminal connector conduit 150 which, together with an associated terminal connector conduit 152 on the cover element 108, forms a terminal connector duct 154.

Flexible printed circuits 156 of the signal conductor system 106 extend through the terminal connector recess or the terminal connector duct 154.

At their ends located outside the support element 102, the flexible printed circuits 156 carry a signal conductor terminal connector 158 which has a plurality of connector pins and is configured to be brought into contact with a signal conductor element (not illustrated) complementing the signal conductor terminal connector 158.

The signal conductor terminal connector 158 may for example take the form of a socket connector for a signal conductor. In this case, the signal conductor element that takes a form complementing the signal conductor terminal connector 158 preferably takes the form of a plug connector for a signal conductor.

However, it may also be provided for the signal conductor terminal connector 158 to take the form of a plug connector for a signal conductor and for the signal conductor element complementing the signal conductor terminal connector 158 to take the form of a socket connector for a signal conductor.

The signal conductor terminal connector 158 serves to connect the signal conductor system 106 that is arranged on the support element 102 to a monitoring arrangement (not illustrated) of the electrochemical device 112 by way of a preferably multipolar connection line (not illustrated).

The signal conductor system 106 serves to connect one or more voltage tap points 160 on a respective cell connector 124 or current terminal connector 126 and/or one or more sensors, in particular temperature sensors 162, of the cell contact-making system 100 to the signal conductor terminal connector 158.

The signal conductor system 106 includes one or more signal conductors 164 which each electrically conductively connect a signal source 166 to the signal conductor terminal connector 158.

If the signal source 166 is a voltage tap point 160 on a cell connector 124 or current terminal connector 126, then this signal source 166 is connected to the signal conductor terminal connector 158 by way of a voltage tapping line 168.

If the signal source 166 is a temperature sensor 162, then the signal source 166 is electrically conductively connected to the signal conductor terminal connector 158 by means of one or more temperature measuring lines 169.

The temperature sensors 162 may for example be in contact with a contact region 122 of a cell connector 124 or current terminal connector 126 of the cell contact-making system 100 in order to be able to measure the temperature prevailing there.

Each of the contact regions 122 of the cell connectors 124, and each current terminal connector 126, is associated with a respective cell terminal 116 of the electrochemical device 112 and, in the assembled condition of the electrochemical device 112, is electrically conductively connected, preferably in a substance-to-substance bond, to the respectively associated cell terminal 116.

Each cell connector 124 includes two contact regions 122 for making electrical contact between a respective cell terminal 116 and a compensation region 170 which connects the two contact regions 122 to one another.

The compensation region 170 is preferably elastically and/or plastically deformable in order to enable relative movement of the two contact regions 122 of the cell connector 124 in relation to one another, during operation of the electrochemical device and/or for the purpose of compensating tolerance when the cell contact-making system 100 is assembled.

To this end, the compensation region 170 may in particular have one or more compensation corrugations 172. The compensation corrugations 172 preferably run transversely, in particular substantially perpendicular, to a direction of connection which connects a center point of the first contact region 122a and a center point of the second contact region 122b of the cell connector 124.

Each contact region 122 of a cell connector 124 or current terminal connector 126 may be positioned, by means of a respective positioning hole 174, on a respectively associated positioning pin 176 of the support element 102.

As mentioned above, the signal conductor system 106 includes one or more flexible printed circuits 156.

Figure 11:
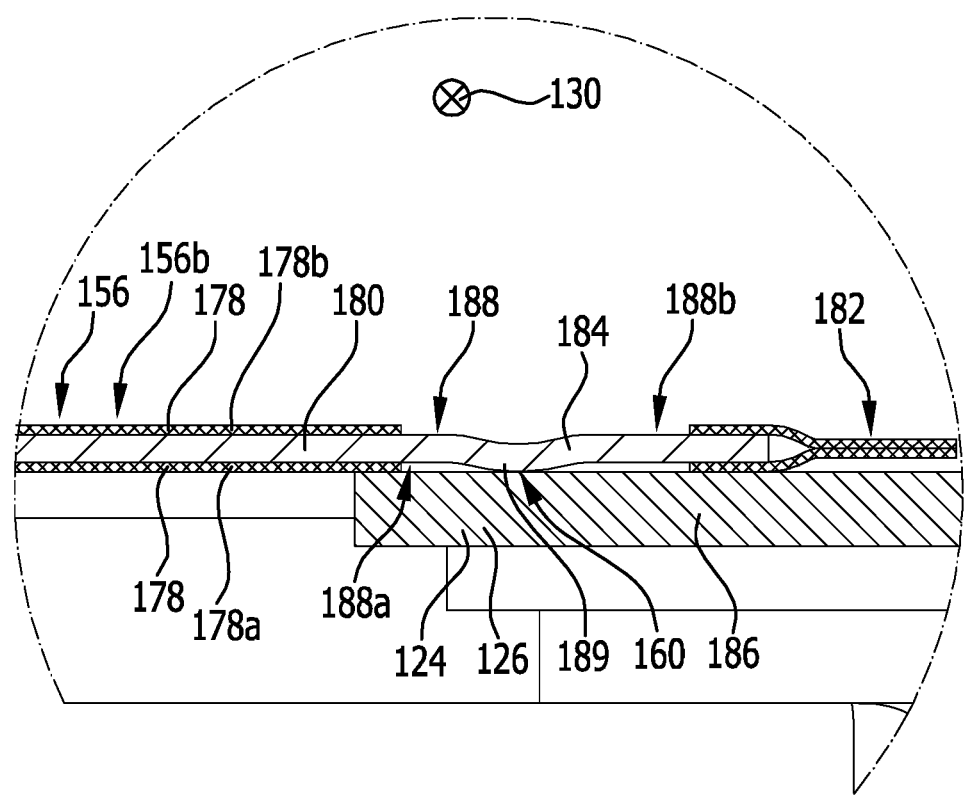
FIG. 11 shows an enlarged representation of the region III in FIG. 10, which shows how a connection portion of a conductor track of the signal conductor system is directly connected to a base body of a cell connector or current terminal connector of the current conductor system.

The construction of a printed circuit 156 of this kind can best be seen from the sectional illustration in FIG. 11.

In this exemplary embodiment, each flexible printed circuit 156 includes two insulating films 178, which are electrically insulating and between which there are arranged electrically conductive conductor tracks 180.

The conductor tracks 180 form the signal conductors 164 of the signal conductor system 106 and are preferably made from an electrically conductive metal material, for example copper, a copper alloy, aluminum or an aluminum alloy.

The conductor tracks 180 may for example be separated from a starting material, in particular a conductor foil, for example being punched or cut out.

The insulating films 178 are preferably made from an electrically insulating plastics material.

The insulating films 178 are made thin in order not to impair the flexibility of the printed circuit 156 formed therefrom.

In particular, it may be provided for each insulating film 178 to have a thickness of less than 0.5 mm.

Each insulating film 178 is preferably provided on the side facing the other insulating film 178 with an adhesive layer (not illustrated), with the result that the insulating film 178 takes a form that is adhesive on at least one side.

As can be seen from FIG. 11, at a point where a conductor track 180 is arranged between the insulating films 178, the insulating films 178 adhere to mutually opposite sides of the respective conductor track 180.

In regions projecting beyond the conductor tracks 180, the insulating films 178 adhere to one another, as in the region designated 182 in FIG. 11.

Figure 2:
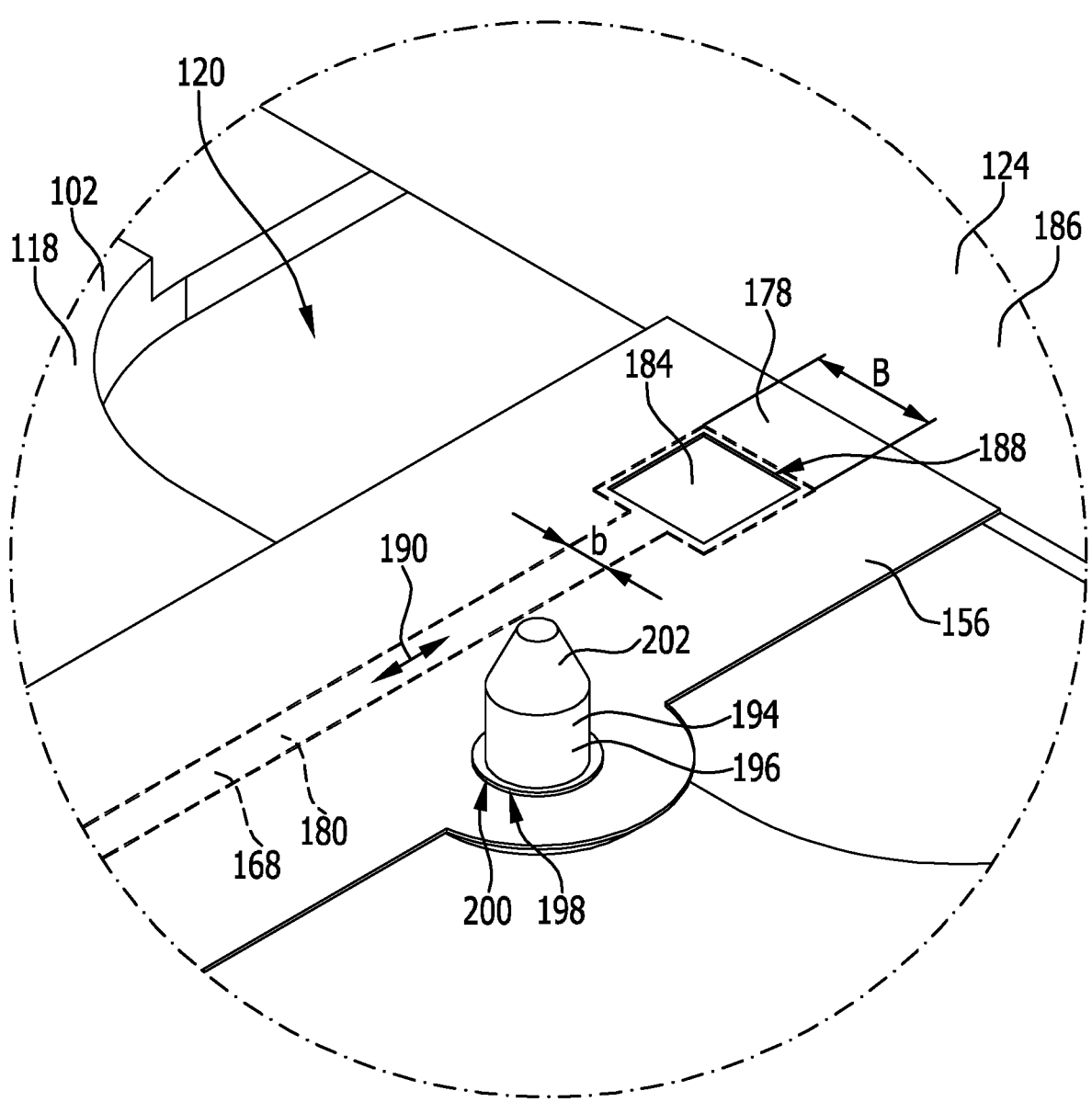
FIG. 2 shows an enlarged illustration of the region I in FIG. 1.

As can best be seen from FIGS. 2 and 11, the conductor tracks 180 forming the voltage tapping lines 168 include, preferably in their end region remote from the signal conductor terminal connector 158, a connection portion 184 at which the relevant conductor track is electrically conductively connected to a cell connector 124 or current terminal connector 126.

In the embodiment illustrated in FIG. 11, the connection portion 184 of the conductor track 180 is fixed directly on a base body 186 of the cell connector 124 or current terminal connector 126, preferably in a substance-to-substance bond.

In particular, it may be provided for the connection portion 184 to be fixed to the base body 186 by ultrasonic welding, friction welding or friction stir welding. For this reason, the connection portion 184 may also be called a welding pad.

The base body 186 preferably includes at least one contact region 122 of the cell connector 124 or current terminal connector 126.

In order to enable the connection portion 184 of the conductor track 180 to be brought into contact with the base body 186, the insulating films 178 of the flexible printed circuit 156 preferably each have a window 188 in the region of the connection portion 184.

Here, the connection portion 184 is configured to be brought into contact with the base body 186 through the window 188a in the insulating film 178a facing the base body 186.

The connection portion 184 is configured to be brought into contact with a suitable tool for joining, for example a sonotrode, through a window 188b in the insulating film 178b remote from the base body 186, in order to join the connection portion 184 of the conductor track 180 to the base body 186 of the cell connector 124 or current terminal connector 126 when the cell contact-making system 100 is assembled, and consequently to make an electrically conductive connection between the conductor track 180 and the base body 186.

The connection portion 184 preferably has a projection 189 towards the base body 186, by means of which the connection portion 184 abuts against the base body 186, and which can be produced on the connection portion 184 for example by a shaping procedure, in particular a stamping procedure.

As can be seen from FIG. 2, the connection portion 184 preferably has a width B, that is to say an extent perpendicular to the longitudinal direction 190 of the conductor track 180 and parallel to the principal surfaces of the insulating films 178, which is greater than the width b of the principal portion 192 of the conductor track 180 adjoining the connection portion 184, that is to say its extent perpendicular to the longitudinal direction 190 of the conductor track 180 and parallel to the principal surfaces of the insulating film 178.

Preferably, it is provided for the width B of the connection portion 184 to be at least twice as great as the width b of the principal portion 192 of the conductor track 180.

In order to enable the flexible printed circuit 156 to be positioned precisely in relation to the cell connectors 124 and current terminal connectors 126 of the current conductor system 104 when the cell contact-making system 100 is assembled, the support element 102 includes positioning elements 194 on the support element side, for example in the form of positioning pegs 196, which cooperate with a respective positioning element 198 on the signal conductor system side, for example in the form of a positioning hole 200, such that the respective flexible printed circuit 156 is positioned in a desired location in relation to the support element 102 and thus in relation to the current conductor system 104 held on the support element 102.

In order to make it easier to insert a positioning peg 196 into an associated positioning hole 200, the positioning peg 196 may be provided with a chamfered shape 202.

Preferably, there is associated with each connection portion 184 of a conductor track 180 respectively a positioning element 198 on the signal conductor system side and a positioning element 194 on the support element side.

Instead of welding, the connection portion 184 of the conductor track 180 may also be fixed to the base body 186 of the cell connector 124 or current terminal connector 126 by soldering.

As can be seen for example from FIG. 1, a connection portion 184 of a conductor track 180 may also be electrically conductively connected to a terminal connector conductor 202 of a temperature sensor 162, instead of to the base body 186 of a cell connector 124 or current terminal connector 126.

This electrical connection also preferably takes the form of a substance-to-substance bond, for example by ultrasonic welding, friction welding or friction stir welding.

The conductor track 180 that is connected to a terminal connector conductor 202 of a temperature sensor 162 forms a temperature measuring line 169 of the signal conductor system 106.

The signal conductor system 106 may also have a sensor 204 that is arranged directly on a flexible printed circuit 156 of the signal conductor system 106 and is electrically conductively connected to one or more conductor tracks 180.

A sensor 204 of this kind may for example take the form of a temperature sensor.

A temperature sensor of this kind may for example take the form of an NTC element.

The sensor 204 may adhere to at least one insulating film 178 of the flexible printed circuit 156.

The sensor 204 may be at least partly received between two insulating films 178 of the flexible printed circuit 156.

As can be seen from FIGS. 1 and 9, a sensor portion 206, carrying the sensor 204, of a flexible printed circuit 156 of the signal conductor system 106 may extend through a passage opening 208 in the support element 102, in particular at the edge region 138 of the support element 102, from an internal space 210 of the cell contact-making system 100 into an external space 212 of the cell contact-making system 100.

The internal space 210 of the cell contact-making system 100 is in this case the space enclosed by the support element 102 and the cover element 108.

Figure 8:
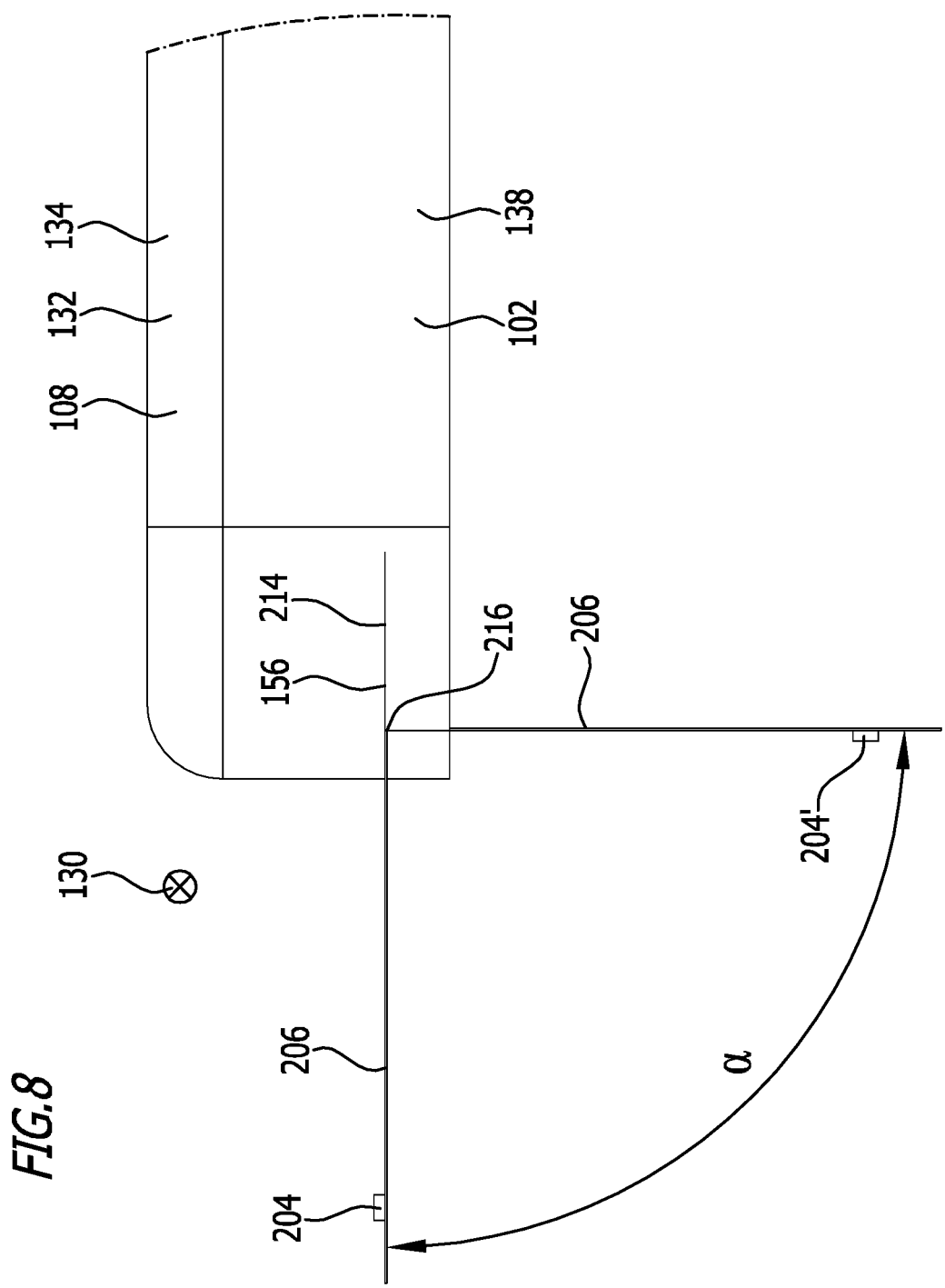
FIG. 8 shows an enlarged illustration of the region II in FIG. 7.

As can best be seen from FIG. 8, the sensor portion 206, carrying the sensor 204, of the flexible printed circuit 156 can be pivoted (for example about an angle α of approximately 90°) about a fold line 216 in relation to a feeder portion 214, upstream of the sensor portion 206, of the flexible printed circuit 156 as a result of the flexibility of the flexible printed circuit 156 such that the sensor 204 is movable, as a result of this deformation of the flexible printed circuit 156, from a first position in relation to the support element 102 (designated by the reference numeral 204 in FIG. 8) into a second position in relation to the support element 102 (designated by the reference numeral 204' in FIG. 8).

Here, in the first position the sensor 204 is arranged in the external space 212 of the cell contact-making system 100 and outside the housing 110 of the electrochemical device 112, while in the second position, in the assembled condition of the electrochemical device 112, the sensor 204' is arranged between one of the electrochemical cells 114 and the housing 110 of the electrochemical device 112.

During assembly of the cell contact-making system 100 on the electrochemical device 112, it is thus possible, as a result of a simple deformation of the flexible printed circuit 156, to make a decision on the position at which the sensor 204 is to be arranged during operation of the electrochemical device 112.

If the sensor 204 is a temperature sensor, it is thus possible, during assembly of the cell contact-making system 100 on the electrochemical device 112, to make a decision on whether a temperature outside the electrochemical device 112 or a temperature in the housing 110 of the electrochemical device 112 is to be measured.

Figure 4:
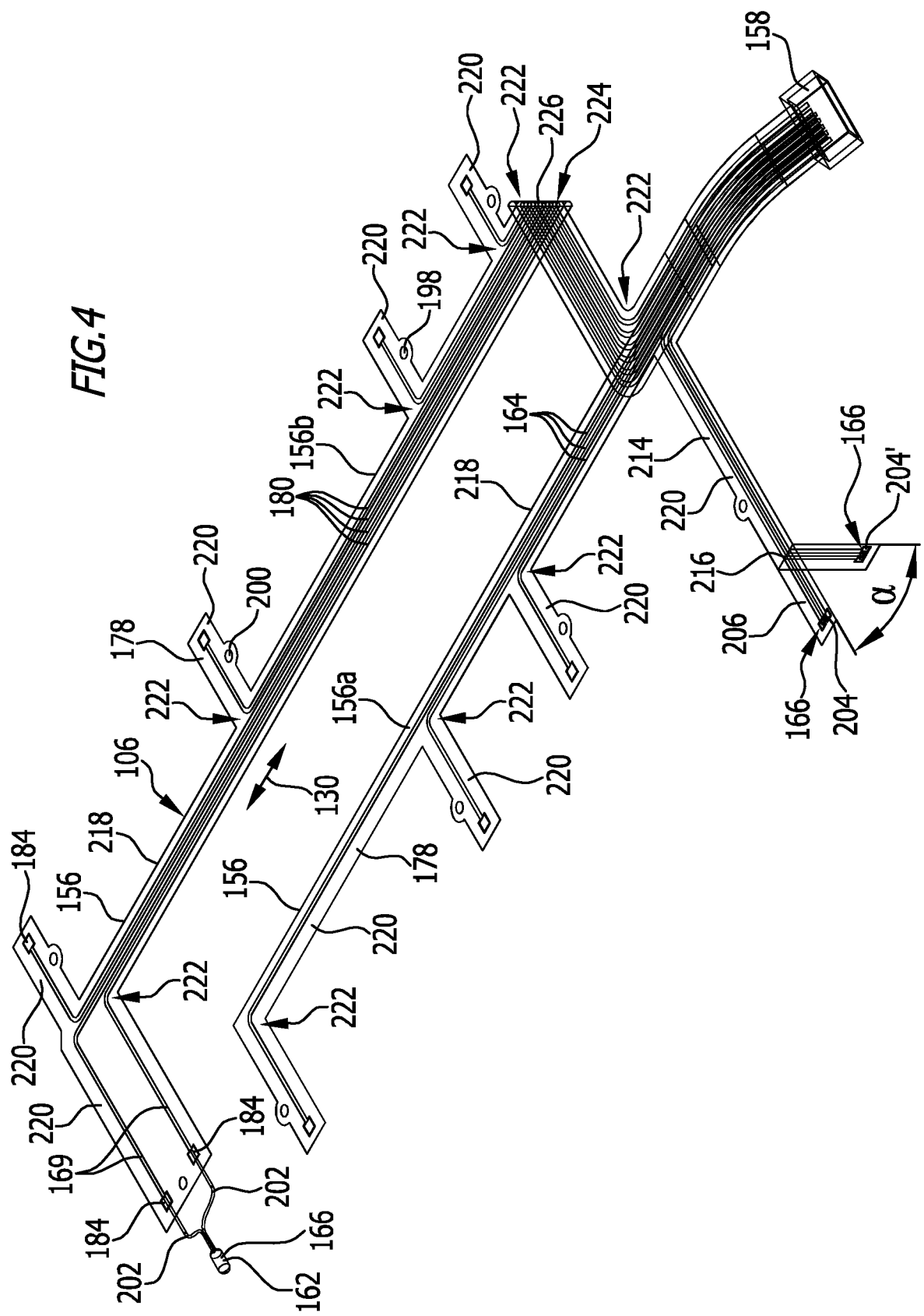
FIG. 4 shows a perspective illustration of the signal conductor system from FIG. 1.

As can best be seen from FIG. 4, which shows the signal conductor system 106 of the cell contact-making system 100 separately, each of the flexible printed circuits 156 of the signal conductor system 106 can include a principal portion 218 on which conductor tracks 180 leading to a plurality of signal sources 166 are arranged, and secondary portions 220 that branch off from the principal portion 218 and on which in each case only one additional conductor track 180 or a plurality of conductor tracks 180 leading to the same signal source 166 are arranged.

One of these secondary portions 220 of the flexible printed circuit 156a can in this case include the sensor portion 206 carrying the sensor 204, and the feeder portion 214 connecting the sensor portion 206 to the principal portion 218.

Each flexible printed circuit 156 may include one or more bend regions 222, in which the longitudinal direction 190 of at least one of the conductor tracks 180 arranged in the bend region 222 changes, preferably by substantially 90°.

At the bend regions 222 in which a secondary portion 220 branches off from a principal portion 218 of a flexible printed circuit 156, the longitudinal direction of a conductor track 180 or a plurality of conductor tracks 180 leading to the same signal source 166 changes.

In bend regions 222 in which the principal portion 218 of a flexible printed circuit 156 changes its direction as a whole, the longitudinal directions 190 of all the conductor tracks 180 that pass through the relevant bend region 222 change.

A bend region of this kind may in particular take the form of a folded region 224 in which the flexible printed circuit 156 (for example the flexible printed circuit 156b) is folded along a fold line 226, in particular being folded back on itself.

Here, there is a change in the relative positioning of the insulating films 178 of the flexible printed circuit 156 in respect of the support element 102. The insulating film 178 that faces towards the support element 102 in the portion of the flexible printed circuit 156 between the signal conductor terminal connector 158 and the folded region 224 faces away from the support element 102 in the portion of the flexible printed circuit 156 after the folded region 224, and the insulating film 178 that faces away from the support element 102 in that between the signal conductor terminal connector 158 and the folded region 224 faces towards the support element 102 in the portion of the flexible printed circuit 156 after the folded region 224.

By providing a folded region 224 of this kind, in the condition mounted on the support element 102 the external contour of a flexible printed circuit 156 may differ from the external contour with which the insulating films 178 of the flexible printed circuit 156 were separated from a starting material, in particular punched or cut out.

As a result, it is possible to reduce material loss when the insulating films are separated out of the starting material.

Moreover, a bend region 222 taking the form of a folded region 224 needs less space than another bend region 222 in which the conductor tracks 180 that pass through the bend region 222 are curved in form.

The cell contact-making system 100 described above is preferably pre-assembled complete, as a separate module of the electrochemical device 112.

To make the flexible printed circuits 156 of the signal conductor system 106, the insulating films 178 are separated out of a starting material with the desired external contour.

The conductor tracks 108 are likewise separated out of a starting material with the desired external contour and placed on the adhesive layer of one of the insulating films 178.

Then, the second insulating film 178 is placed, with its adhesive layer first, on the conductor tracks 180 and the first insulating film 178, and is pressed to the conductor tracks 180 and the first insulating film 178 in order to make a substance-to-substance bond.

The terminal connector conductors 202 of any temperature sensor 162 that is present are connected to the associated connection portions 184 of conductor tracks 180, preferably in a substance-to-substance bond.

Any sensor 204 that is present is connected to the associated conductor tracks 180 and arranged, together with the conductor tracks 180, at least partly between the insulating films 178. Part of the sensor 204 may pass through a passage opening in one of the insulating films 178.

The end regions of the conductor tracks 180 remote from the connection portions 184 of the conductor tracks 180 are connected to connector pins of the signal conductor terminal connector 158.

Thus, the flexible printed circuits 156 of the signal conductor system 106 and the signal conductor terminal connector 158, together with the temperature sensor 162 and the sensor 204 that is integrated into a flexible printed circuit 156, represent a module that is configured to be handled as a unit.

The constituent parts of the current conductor system 104, in particular the cell connectors 116 and the current terminal connectors 118, are positioned on the support element 102.

Then, the signal conductor system 106 is positioned on the support element 102, wherein the positioning elements 198 on the signal conductor system side cooperate with the respectively associated positioning elements 194 on the support element side.

Then, the voltage tap points 160 of the cell connectors 124 and current terminal connectors 126 are electrically conductively connected to the respectively associated connection portions 184 of the conductor tracks 180 of the signal conductor system 106.

Thus, all the components in the cell contact-making system 100 that are required for the electrochemical cells 114 of the electrochemical device 112 to make contact are already brought together in the required relative positions.

During assembly of the electrochemical device 112, the support element 102, with the current conductor system 104 and the signal conductor system 106, is placed on the housing 110 in which the electrochemical cells 114 are arranged, and is connected to the edge of the housing 110 surrounding the housing opening.

Then, the cell connectors 124 and current terminal connectors 126 are brought into electrically conductive contact with the respectively associated cell terminals 116 of the electrochemical device 112, for example by a substance-to-substance bond, in particular by welding, and/or by positive locking.

Once contact has been made between the current conductor system 104 and the cell terminals 116 of the electrochemical cells 114 of the electrochemical device 112, the cover element 108 is placed on the support element 102 and connected thereto, preferably detachably, in particular by latching, with the result that the cover element 108 covers the current conductor system 104 and the signal conductor system 106 of the cell contact-making system 100 and protects them from undesirable contact.

This prevents damage to the current conductor system 104 and the signal conductor system 106 during transport and assembly of the electrochemical device 112.

The fully assembled electrochemical device 112 may be combined with a plurality of other electrochemical devices 112, in particular battery modules, to form an electrochemical device group, wherein in particular different electrochemical devices 112 may be connected together by means of module connectors (not illustrated) that connect the current terminal connectors 126 of different electrochemical devices 112 to one another.

Figure 12:
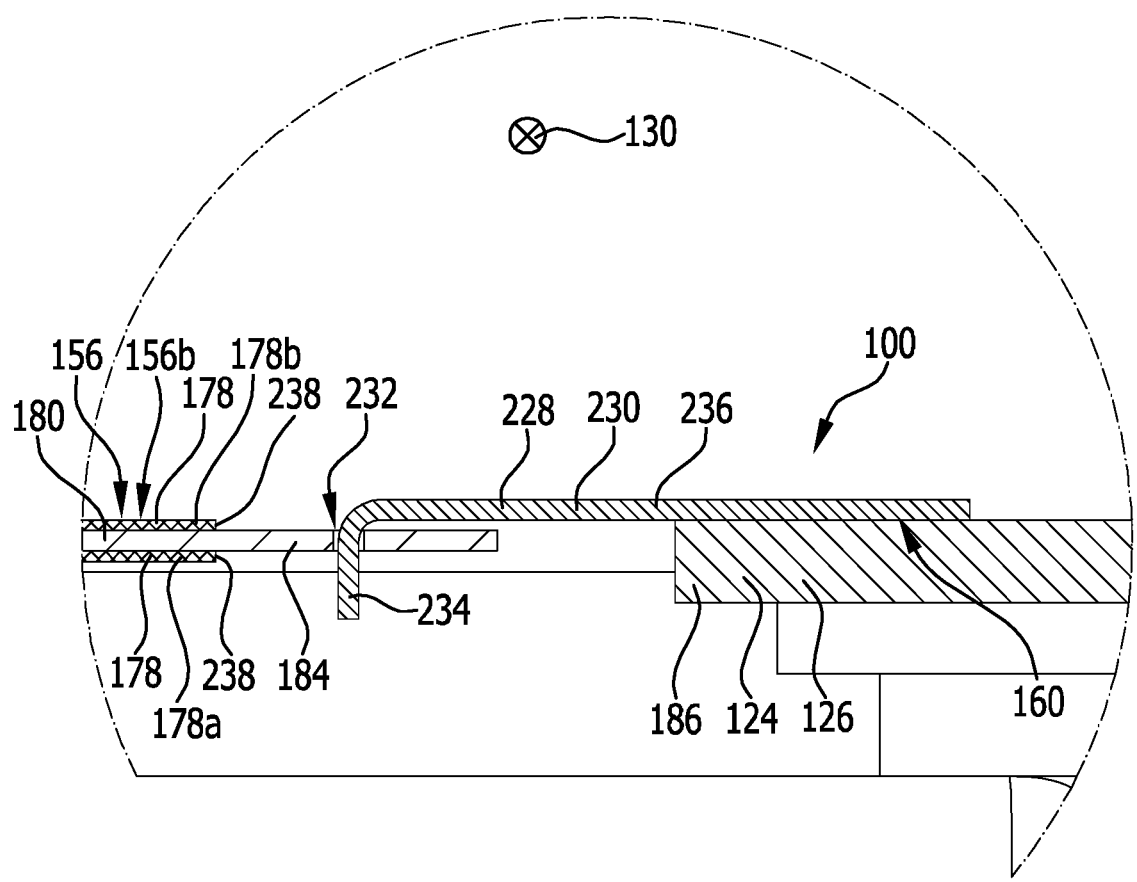
FIG. 12 shows a representation, corresponding to FIG. 11, of an electrically conductive connection between a connection portion of a conductor track and a cell connector or current terminal connector in a second embodiment, in which the connection portion is connected to the base body of the cell connector or current terminal connector by way of an angled terminal connector element.

A second embodiment of a cell contact-making system 100, of which a detail is illustrated in FIG. 12, differs from the first embodiment illustrated in FIGS. 1 to 11 in that the connection portions 184 of the conductor tracks 180 of the flexible printed circuits 156 are not fixed directly to a base body 186 of the respectively associated cell connector 124 or current terminal connector 126.

Rather, in this embodiment at least one connection portion 184 is electrically conductively connected to the respectively associated cell connector 124 or current terminal connector 126 indirectly, by way of a terminal connector element 228, for example in the form of a terminal connector lug 230.

Here, the terminal connector element 228 may in particular extend through a passage opening 232 in the connection portion 184.

The electrically conductive connection between the connection portion 184 and the terminal connector element 228 is preferably made by a substance-to-substance bond, in particular by soldering and/or welding.

The electrically conductive connection between the terminal connector element 228 and the base body 186 of the cell connector 124 or current terminal connector 126 is preferably made by a substance-to-substance bond, in particular by welding, for example by ultrasonic welding, friction welding or friction stir welding.

The terminal connector element 228 may in particular take an angled form, with a first limb 234 that extends through the passage opening 232 in the connection portion 184, and a second limb 236 that abuts, preferably flat, against the base body 186.

Further, in this embodiment it may be provided for the connection portion 184 to project laterally beyond an outer edge 238 of the insulating films 178 of the flexible printed circuit 156.

In that case, it is not necessary to provide windows 188 in the insulating films 178 in order to be able to join the connection portion 184 to the terminal connector element 228.

Otherwise, the second embodiment, illustrated in FIG. 12, of the cell contact-making system 100 corresponds, as regards its structure, functioning and manufacture, to the first embodiment illustrated in FIGS. 1 to 11, so in this respect reference is made to the description thereof above.

Figure 13:
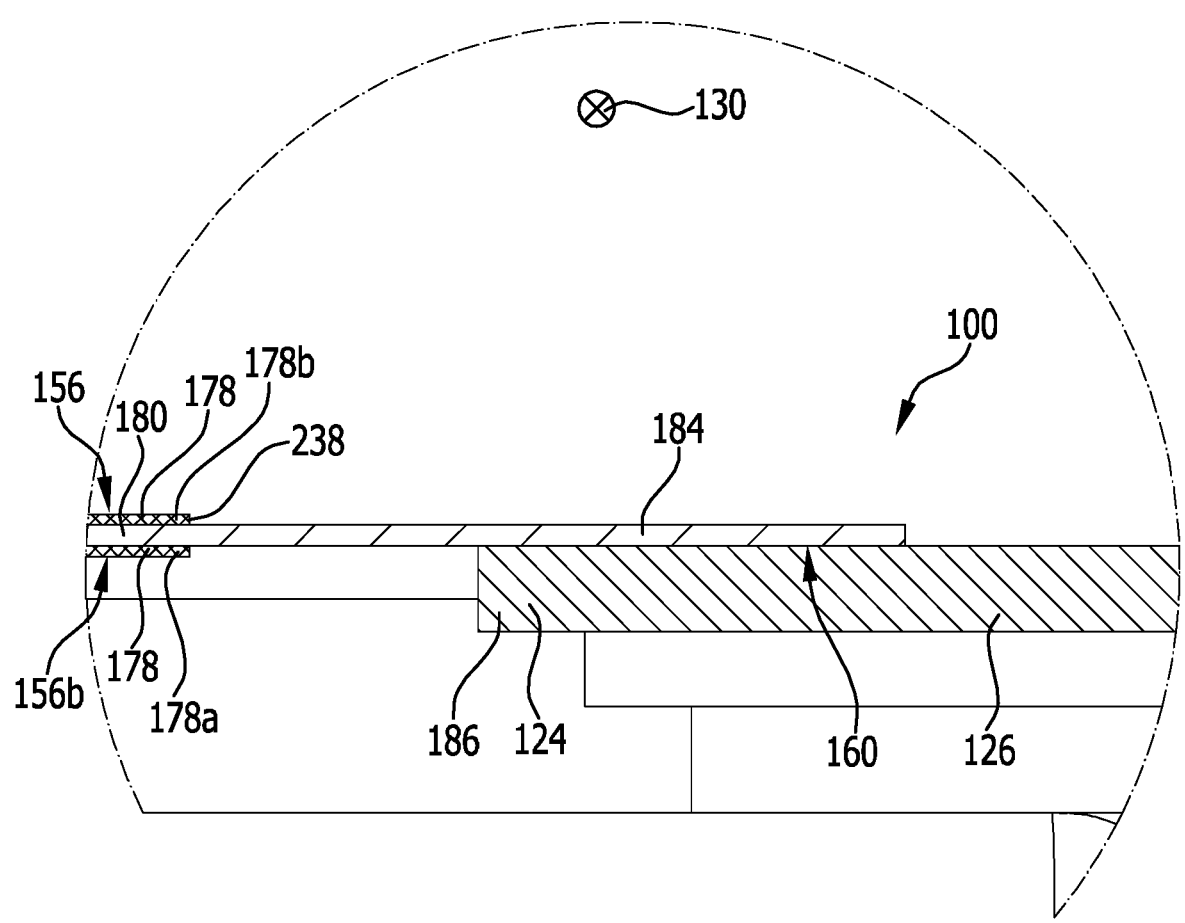
FIG. 13 shows a representation, corresponding to FIG. 11, of a connection between a conductor track and a cell connector or current terminal connector in a third embodiment, in which the conductor track projects beyond insulating films of the flexible printed circuit and is fixed directly to a base body of the cell connector or current terminal connector.

A third embodiment of a cell contact-making system 100, of which a detail is illustrated in FIG. 13, differs from the first embodiment illustrated in FIGS. 1 to 11 in that at least one connection portion 184 of a conductor track 180 of a flexible printed circuit 156 which is to be electrically conductively connected to a cell connector 124 or current terminal connector 126 of the current conducting system 104 projects laterally beyond an outer edge 238 of the insulating films 178 and, in the projecting region, is directly fixed, preferably in a substance-to-substance bond, to a base body 186 of the cell connector 124 or current terminal connector 126, for example by ultrasonic welding, friction welding or friction stir welding.

In this case, it is not necessary to provide windows 188 in the insulating films 178 in order to be able to join the connection portion 184 to the base body 186.

Otherwise, the third embodiment, illustrated in FIG. 13, of the cell contact-making system 100 corresponds, as regards its structure, functioning and manufacture, to the first embodiment illustrated in FIGS. 1 to 11, so in this respect reference is made to the description thereof above.

Figure 14:
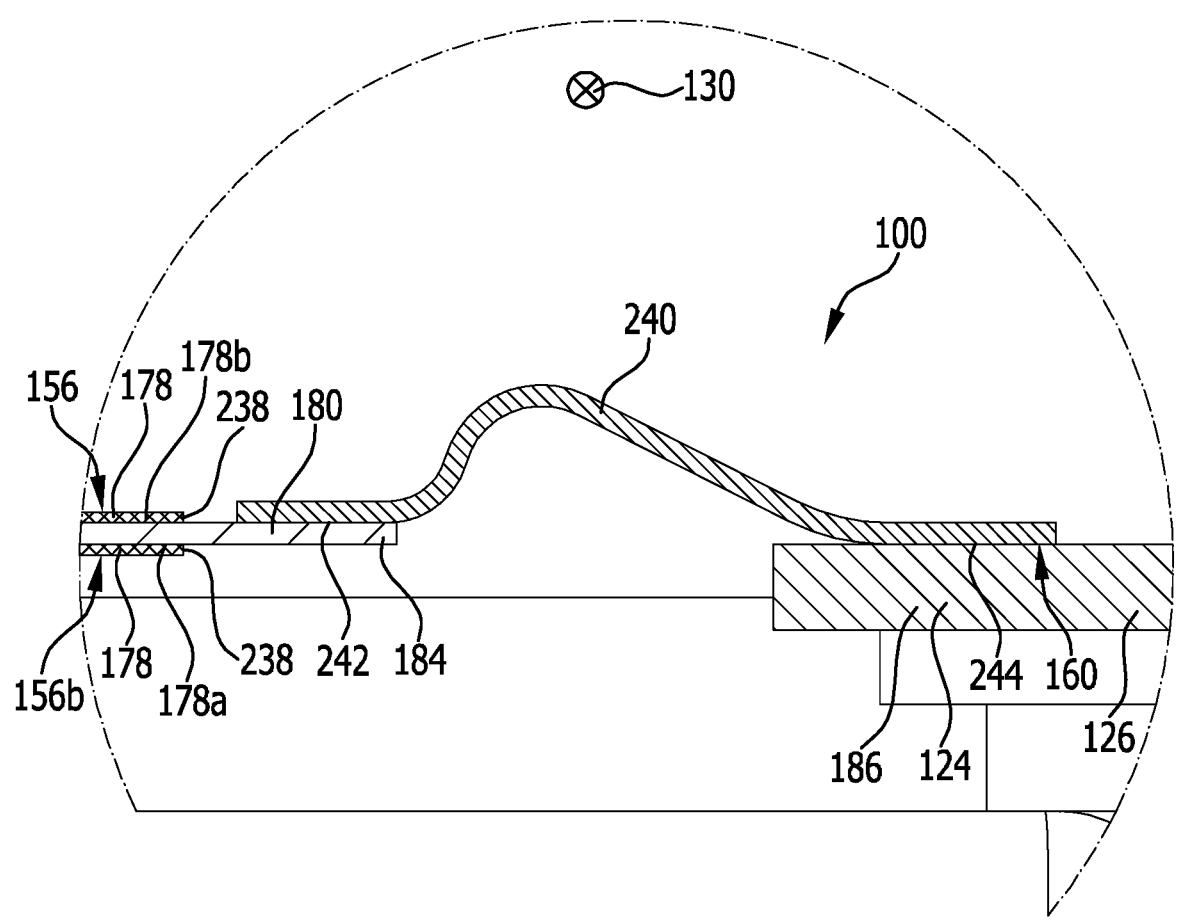
FIG. 14 shows a representation, corresponding to FIG. 11, of the connection between a connection portion of a conductor track and a cell connector or current terminal connector in a fourth embodiment, in which the connection portion is connected to a base body of the cell connector or current terminal connector by means of a bonding conductor.

A fourth embodiment of a cell contact-making system 100, of which a detail is illustrated in FIG. 14, differs from the first embodiment illustrated in FIGS. 1 to 11 in that the connection portions 184 of the conductor tracks 180 of the flexible printed circuits 156 are not fixed directly to a base body 186 of an associated cell connector 124 or current terminal connector 126.

In this embodiment at least one connection portion 184 of a conductor track 180 is electrically conductively connected to the base body 186 of the cell connector 124 or current terminal connector 126 indirectly, by means of a bonding conductor 240.

The bonding conductor 240 is preferably connected to the connection portion 184 by means of a bonding connection 242 and is preferably connected to the base body 186 by means of a further bonding connection 244.

The bonding conductor 240 preferably includes a bonding wire.

The bonding wire preferably has a wire thickness of at least 100 μm.

The material of the bonding conductor 240 preferably includes aluminum, gold, platinum, brass and/or copper.

In particular, there may be used as the material for the bonding conductor 240 an aluminum alloy or a copper alloy.

A particularly suitable bonding wire material contains 99.99% aluminum.

The bonding conductor 240 may be bare or provided with an insulation.

The bonding conductor 240 may in principle have any desired cross sectional shape.

Preferably, the bonding conductor 240 has a substantially circular or substantially rectangular cross section.

Further, there may be used as the material for the bonding conductor 240 a multi-stranded wire.

For making a bonding connection 242, 244 between the bonding material and one of the materials to be bonded, the bonding material is pressed at a defined contact pressure onto the surface of the material to be bonded with which contact is to be made by means of the bonding tip of a bonding tool (not illustrated). Then, through the combination of the contact pressure (bonding force) and the ultrasonic vibrations of the bonding tip, the bonding material is welded to the material to be bonded, for example the connection portion 184 of the conductor tracks 180 or the base body 186 of the cell connector 124 or current terminal connector 128.

Further, in this embodiment too it may be provided for the connection portion 184 to project laterally beyond an outer edge 238 of the insulating films 178 of the flexible printed circuit 156.

In that case, it is not necessary to provide windows 188 in the insulating films 178 in order to be able to join the connection portion 184 to the bonding conductor 240.

Otherwise, the fourth embodiment, illustrated in FIG. 14, of the cell contact-making system 100 corresponds, as regards its structure, functioning and manufacture, to the first embodiment illustrated in FIGS. 1 to 11, so in this respect reference is made to the description thereof above.

Figure 15:
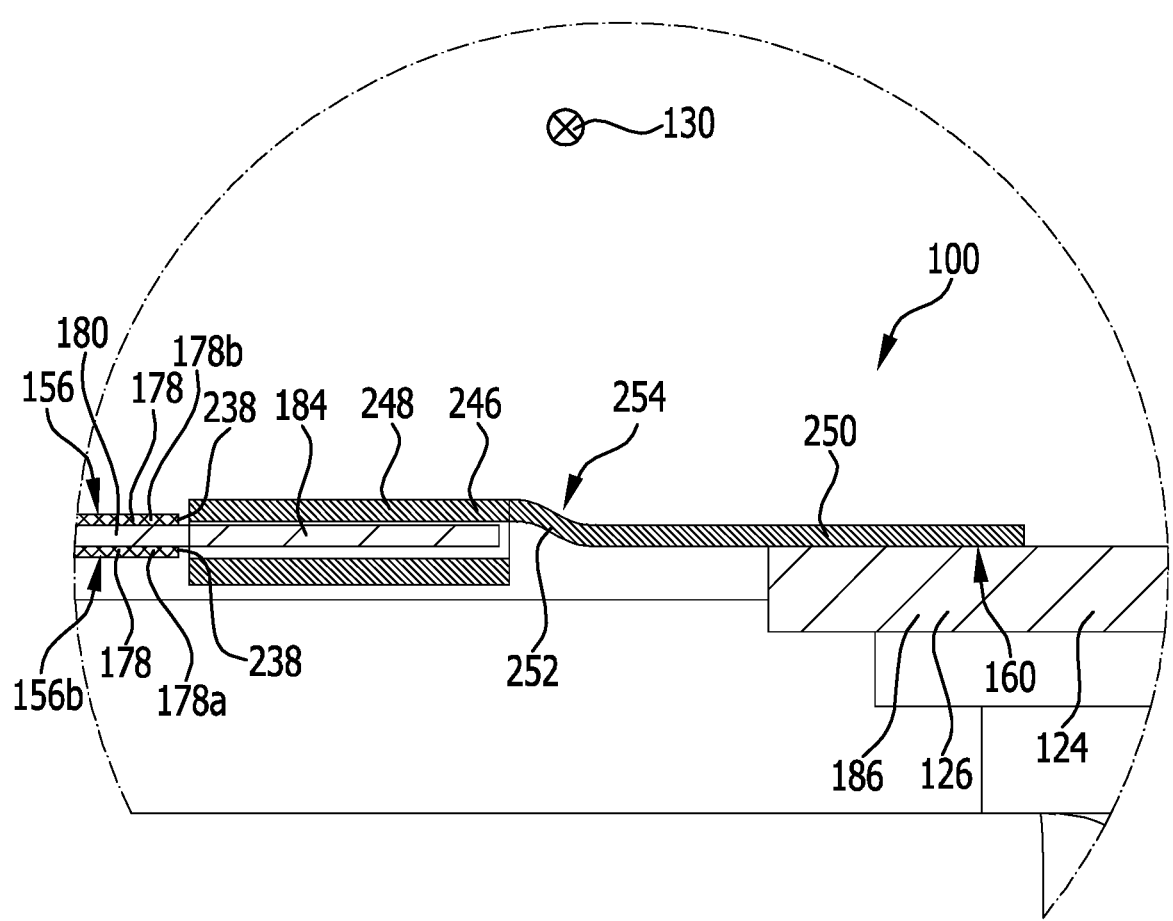
FIG. 15 shows a representation, corresponding to FIG. 11, of the connection between a connection portion of a conductor track and a cell connector or current terminal connector in a fifth embodiment, in which the connection portion is connected to a base body of the cell connector or current terminal connector by means of a crimping element.

A fifth embodiment of a cell contact-making system 100, of which a detail is illustrated in FIG. 15, differs from the fourth embodiment illustrated in FIG. 14 in that the connection portion 184 of at least one conductor track 180 is electrically conductively connected to the base body 186 of an associated cell connector 124 or current terminal connector 126 by means of a crimping element 246.

Here, the crimping element 246 has a crimping portion 248 that is in contact with the connection portion 184 and a terminal connector portion 250 that is in contact with the base body 186.

The terminal connector portion 250 and the crimping portion 248 may be connected to one another by a transition portion 252.

The transition portion 252 may have a crook shape 254.

The terminal connector portion 250 of the crimping element 246 is preferably fixed to the base body 186 in a substance-to-substance bond, in particular by welding, for example ultrasonic welding, friction welding or friction stir welding.

The crimping portion 248 of the crimping element 246 is made by a shaping procedure from a crimping preform, which is for example substantially planar, such that it encloses the connection portion 184 of the conductor track 180 and is held against the connection portion 184 by positive engagement and/or by force locking.

The material of the crimping element 246 preferably includes an electrically conductive metal material, in particular aluminum and/or copper.

In particular, there may be used as the material for the crimping element 246 an aluminum alloy or a copper alloy.

In this embodiment, the connection portion 184 projects laterally beyond an outer edge 238 of the insulating films 178 of the flexible printed circuit 156.

Otherwise, the fifth embodiment, illustrated in FIG. 15, of the cell contact-making system 100 corresponds, as regards its structure, functioning and manufacture, to the first embodiment illustrated in FIGS. 1 to 11, so in this respect reference is made to the description thereof above.

The invention claimed is:

1. A cell contact-making system for an electrochemical device that includes a plurality of electrochemical cells, wherein the cell contact-making system includes a signal conductor system having one or more signal conductors for electrically conductively connecting a signal source to a signal conductor terminal connector or to a monitoring arrangement of the electrochemical device, wherein the signal conductor system includes at least one flexible printed circuit, wherein the flexible printed circuit includes at least one flexible insulating film and at least one conductor track that is arranged on the insulating film.

2. The cell contact-making system according to claim 1, wherein the cell contact-making system includes at least one cell connector for electrically conductively connecting cell terminals of different electrochemical cells and/or at least one current terminal connector for electrically conductively connecting the electrochemical device to another electrochemical device or to a consumer, wherein at least one conductor track includes a connection portion at which the conductor track is electrically conductively connected to a cell connector or a current terminal connector.

3. The cell contact-making system according to claim 2, wherein the connection portion is fixed directly to a base body of the cell connector or current terminal connector.

4. The cell contact-making system according to claim 3, wherein the connection portion is fixed to the base body by ultrasonic welding, friction welding, friction stir welding or soldering.

5. The cell contact-making system according to claim 2, wherein the connection portion projects beyond an outer edge of the at least one insulating film.

6. The cell contact-making system according to claim 2, wherein the at least one insulating film has, in the region of the connection portion, a window which is configured for contact to be made therethrough between the connection portion and the cell connector or current terminal connector or a joining tool.

7. The cell contact-making system according to claim 2, wherein the connection portion has a region that projects towards the cell connector or current terminal connector.

8. The cell contact-making system according to claim 2, wherein the connection portion is electrically conductively connected to the cell connector or current terminal connector by way of a terminal connector element.

9. The cell contact-making system according to claim 2, wherein the connection portion is electrically conductively connected to the cell connector or current terminal connector by means of a bonding conductor.

10. The cell contact-making system according to claim 2, wherein the connection portion is electrically conductively connected to the cell connector or current terminal connector by means of a crimping element.

11. The cell contact-making system according to claim 1, wherein the flexible printed circuit includes at least two flexible insulating films between which at least one conductor track is arranged.

12. The cell contact-making system according to claim 1, wherein at least one flexible printed circuit has at least one fold.

13. The cell contact-making system according to claim 1, wherein the signal conductor system has a sensor which is arranged on a flexible printed circuit of the signal conductor system and is electrically conductively connected to at least one conductor track of the flexible printed circuit.

14. The cell contact-making system according to claim 13, wherein the cell contact-making system includes a support element on which the signal conductor system is arranged, wherein the sensor is movable, as a result of deformation of the flexible printed circuit, from a first position in relation to the support element into a second position in relation to the support element.

15. The cell contact-making system according to claim 13, wherein the support element has a passage opening through which there extends a sensor portion, carrying the sensor, of a flexible printed circuit of the signal conductor system.

16. The cell contact-making system according to claim 13, wherein the sensor takes the form of a temperature sensor.

17. The cell contact-making system according to claim 1, wherein the cell contact-making system includes a support element on which the signal conductor system is arranged, wherein the support element includes at least one positioning element on the support element side which cooperates with a positioning element on the signal conductor system side such that the signal conductor system is positioned in a desired location in relation to the support element.

18. The cell contact-making system according to claim 17, wherein the support element is placeable on a housing of the electrochemical device in which a plurality of electrochemical cells are arranged.

\* \* \* \* \*